(12) United States Patent
Colbert et al.

(10) Patent No.: US 6,385,044 B1
(45) Date of Patent: May 7, 2002

(54) HEAT PIPE HEAT SINK ASSEMBLY FOR COOLING SEMICONDUCTOR CHIPS

(75) Inventors: John Lee Colbert, Byron, MN (US); John Saunders Corbin, Jr., Austin, TX (US); Roger Duane Hamilton, Eyota, MN (US); Danny E. Massey, Austin, TX (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/917,446

(22) Filed: Jul. 27, 2001

(51) Int. Cl.[7] .................................................. H05K 7/20
(52) U.S. Cl. ........................ 361/700; 361/704; 361/699; 361/707; 361/709; 257/714; 257/718; 257/719; 257/727; 174/15.2; 165/80.4; 165/104.34; 165/185
(58) Field of Search ................................. 361/687–690, 361/699, 700, 702–704, 709, 719, 720; 257/714, 718, 719, 727; 174/15.1, 15.2, 16.3; 165/80.3, 80.4, 104.33, 104.34

(56) References Cited

U.S. PATENT DOCUMENTS 4,951,740 A * 8/1990 Peterson et al. .............. 165/32
5,162,974 A * 11/1992 Currie .......................... 361/700
5,662,163 A   9/1997 Mira ........................... 165/80.3
5,847,366 A * 12/1998 Grunfeld ...................... 219/497
6,061,235 A * 5/2000 Cromwell et al. ........... 361/690
6,196,659 B1 * 1/2001 Wheaton ...................... 361/704

FOREIGN PATENT DOCUMENTS

JP        359208761 A  * 11/1984  ................. 257/715

OTHER PUBLICATIONS

IBM Technical Disclosure Bulletin, vol. 21, No. 2, Jul. 1978, pp. 747–748, "Air–Cooled Chip Conduction Module" by O. R. Gupta.

* cited by examiner

Primary Examiner—Leo P. Picard
Assistant Examiner—Boris L. Chervinsky
(74) Attorney, Agent, or Firm—Robert R. Williams (57) ABSTRACT

An apparatus and method are disclosed to provide heat pipe cooling for semiconductor chips mounted on a module. Each chip is provided its own heat pipe for cooling. A piston on the end of each heat pipe is loaded against each chip with a predetermined force without the need for counting turns of a screw or use of torque measurement tools. Each heat pipe draws heat away from the chip it is loaded against, carrying the heat to a heat sink for dissipation into the ambient. A large multichip module can be loaded against a land grid array interposer with uniform loading of the interposer. This interposer loading is accomplished independently of the loading of the heat pipes against the chips.

18 Claims, 12 Drawing Sheets

HEAT PIPE HEAT SINK ASSEMBLY FOR COOLING SEMICONDUCTOR CHIPS

FIELD OF THE INVENTION

This invention relates to large land grid array integrated circuit packages, and in particular to removal of heat from integrated circuit chips mounted on such packages through the use of heat pipes.

BACKGROUND OF THE INVENTION

Packaging of semiconductor chips is a key contributor to the cost, performance, and reliability of any electronic system, especially electronic digital computer systems. Early transistorized computer systems, such as the IBM 1401, had individual transistors mounted in metal or plastic units with the transistor's three wires extending from the package. These wires would typically be inserted through holes in a printed wiring board (PWB) that had printed wiring on a top or bottom surface, or in some instances, on one or more internal planes in the card. A soldering operation would then electrically connect the transistor's three wires to the printed wiring on the PWB. Resistors, capacitors, diodes, and other electronic components would also be connected in the same way on the PWB to complete the desired circuitry, e.g., logic NANDs, logic NORs, latches, and so forth. The wiring length between these components reduced performance due to time of flight delays. Lengthy wires between the transistors and the PWB also introduced inductive and capacitive parasitics that degraded signal integrity.

By the mid 1960s, multiple transistors and resistors were placed in a single electronic package, or module. Modules were then connected physically and electrically to the PWB with conductors called pins that carried signals from the circuitry on the module to the PWB. These pins would go through holes in the PWB and solder would then make electrical and mechanical connections. These pins could be arranged along the edges of the module or could be arranged as an array of pins protruding from the bottom of the module. These pins brought power and ground connections to the circuitry on the module from the PWB and also provided paths for logic signals between the circuitry and the PWB. These pins were still very limiting in terms of providing low inductance power and ground to the circuitry and in the number of signals that could be received or driven between the circuitry on the module and the PWB.

Still later, direct solder attach between the module and the PWB was accomplished through "ball grid array", "solder bump", or "solder column" packages. Although these packages were electrically superior to the wired or pinned packages they had some limitations. One limitation was the difficulty of reworking the PWB to remove and replace a faulty module. Another limitation was the allowable width and length of the module. This limitation resulted from coefficient of thermal expansion (CTE) mismatches between the materials in the module and the materials in the PWB. The solder connections mechanically fatigued when flexed repeatedly. During a temperature change the solder connections flexed in proportion to how far they were from a central, or neutral, point on the module. Therefore, solder connections on larger modules became fatigued and electrically unreliable from normal thermal variations when the computer was turned on and off repeatedly, or even during normal periods of greater or lesser logic switching activity during normal use. Limitations of this kind of module to PWB connection restricted such packages to moderate width and length dimensions and number of rework cycles that could be performed.

A recent addition to packaging technology is the Land Grid Array (LGA) module. These LGA modules are socketed directly to the PWB with socket connectors, in which the electrical connection is achieved by aligning a contact array on the bottom of the module, a contact array on the top surface of the PWB, and an LGA interposer. The LGA interposer is then compressed between the module and the PWB. Upon sufficient compression, the LGA interposer provides electrical connection between the respective module and PWB array points. The advantage of LGA socket connectors include: field upgradeability; flexibility in system bring-up and diagnosis; reduced PWB assembly rework cost; reduced effects of CTE mismatch between PWB and module; improved electrical performance; and compact designs. There are various types of LGA interposers, including a version based on finely twisted wire, a technology marketed by Cinch Connectors Company. In this approach, palladium or gold plated molybdenum wire is randomly wound to form individual contacts, somewhat similar to a miniature wound-wire scouring pad. These contacts are housed in plastic molded frames. A similar "scouring pad" connector is made by Tecknit Corporation. Another type of LGA interposer is a Metallized Particle Interconnect (MPI™) technology such as is marketed by Tyco International, Ltd. MPI™ has silver-filled elastomeric contacts which are molded onto and through a carrier such as Kapton®, manufactured by the DuPont Corporation, which is staked onto a plastic frame. Yet another type of LGA interposer is the cLGA™ product from InterCon Corporation in which C-shaped clips are individually inserted into cavities molded in a plastic form. Further examples of interposer technologies can be found in the literature and US patents.

LGA socket assemblies are common today in the electronics industry but are typically used to attach single chip modules (SCMs) to PWBs. Relatively small multichip modules (MCM) also exist in the art. The demand for system performance is driving a requirement to place a number of chips, amounting to a large silicon area, on an MCM, while at the same time requiring a very large number of signal, ground, and power supply connections. Each electrical connection on an LGA interposer requires a small amount of force. However in today's large and very high speed systems there are enough connections that well over a half ton of force is required to compress the interposer enough to make reliable connections. Torqueing screws at the corners of the modules has accomplished conventional compression of the LGA interposer. With the increasing size of the sockets and modules, and the large forces required to compress the interposer, it has become problematic to keep the module and the card from unacceptably deforming when tightened from the corners in the conventional manner. Conventional compression pinches the edges of the module against the PWB underneath the edges with no concentrated force under the module itself, which means that the individual LGA connections towards the edge are compressed or deformed with more force than those LGA connections near the middle. Such differences in deformations can cause unreliable connections on the LGA interposer.

Another vital concern in the design of packaging of Very Large Scale Integrated (VLSI) circuit chips is the removal of heat that is produced from the circuitry on the chips. Chip temperature must not be allowed to exceed some maximum temperature because of reliability and performance considerations. Many designs in the past have provided paths for thermal conduction to fins for air cooling or to portions of the module that are cooled by liquids, such as water. A cooling mechanism that has recently been introduced to the field of cooling chips is the heat pipe. Heat pipes have superior heat transfer characteristics but tend to be physically large and must be pressed against the chip with a predefined force. Current use of heat pipes to cool chips involve torqueing tools or methods of counting turns of a screw to ensure proper loading of the heat pipe upon the chip. These methods of loading are error prone, time consuming, and expensive. Furthermore, prior technologies did not support large, LGA MCMs with heat pipe cooling of the chips.

Therefore, there is a need for an LGA socket assembly capable of holding a large MCM and compressing one of a variety of commercially available LGA interposers between the MCM bottom and the PWB top in a manner that maintains substantially uniform force across the LGA interposer. Such an LGA socket assembly further must provide for excellent heat transport away from the chips through the use of heat pipes and the heat pipes should be loaded against the chips without the requirement of counting of screw turns or torque measurement.

SUMMARY OF THE INVENTION

This invention provides an apparatus that provides for substantially uniform loading of an LGA interposer between an MCM and a PWB. The apparatus further provides a mechanism for loading of heat pipe cooling devices against semiconductor chips on the MCM without the requirement of torqueing tools or counting of turns of a screw.

The substantially uniform loading of the LGA interposer is accomplished by turning an actuation screw, which forces down upon the top of a module cap on the MCM. The screw is threaded through an X-shaped loading mechanism. The loading mechanism is mechanically coupled to load posts, which extend through or past the MCM cap; through or past an LGA interposer; through the PWB; through or past a backside stiffener; and are mechanically joined to a load spring. As the actuation screw is actuated, the loading mechanism is forced away from the module cap, putting tension on the load posts and transferring the force to the load spring. A load bushing situated substantially at the center of the load spring pushes against a backside stiffener at or near the center of the backside stiffener, which in turn, pushes against the PWB. This produces a slight convex deformation of the backside stiffener and the portion of the PWB the backside stiffener pushes against. The PWB in turn pushes upward, compressing the LGA interposer against the MCM. Although the actuation screw pushes down at the center of the MCM cap, the module cap supports the MCM at the edges. As the LGA interposer is pressed against the MCM, the center of the MCM is also slightly deformed in a convex manner in the same direction as the backside stiffener, the PWB, and the LGA interposer. In this manner, force can be distributed substantially evenly across the many contacts between the bottom of the MCM and the top of the LGA interposer and also between the bottom of the LGA interposer and the top of the PWB.

Power dissipated on the semiconductor chips must be removed from the chips. Very high-speed processor chips currently dissipate well over 100 watts. The chips must be kept below some maximum temperature for performance and reliability considerations. Current semiconductor chips used in commercial computers typically have a maximum temperature of about 100 degrees centigrade specified. Reliability of the semiconductor chips degrades rapidly beyond this temperature, forcing designers to reduce current densities in wiring on the chip. Other reliability considerations force other design limitations as temperatures rise. Complementary Metal Oxide Semiconductor (CMOS) circuits also degrade in performance as temperature rises, providing even further motivation to effectively remove heat from the chips.

Heat pipes are an excellent means to remove heat. This invention provides a mechanism to load a heat pipe against a chip with a predetermined amount of force without requiring use of torqueing tools or counting turns of a screw. A loading force of the heat pipe against the chip in this invention is determined by the geometries of a load collar and a piston, together with the geometry and spring constant of a spring. The load collar and the spring are coaxially and slideably placed on the heat pipe. The load collar is simply forced downwards, through a hole on the MCM cap, until a flange on the load collar comes into contact with the top of the MCM cap, which stops further travel of the load collar. The spring is compressed between a bottom of the load collar and a top of a piston affixed to a bottom end of the heat pipe, forcing a bottom of the piston against a top of the chip with a force determined by the geometries and the spring as stated above. O-rings on the inner and outer peripheries of the load collar prevent contamination from entering the volume between the top of the MCM and the MCM cap.

DETAILED DESCRIPTION OF THE PREFERRED EMBODIMENTS

Figure 1:
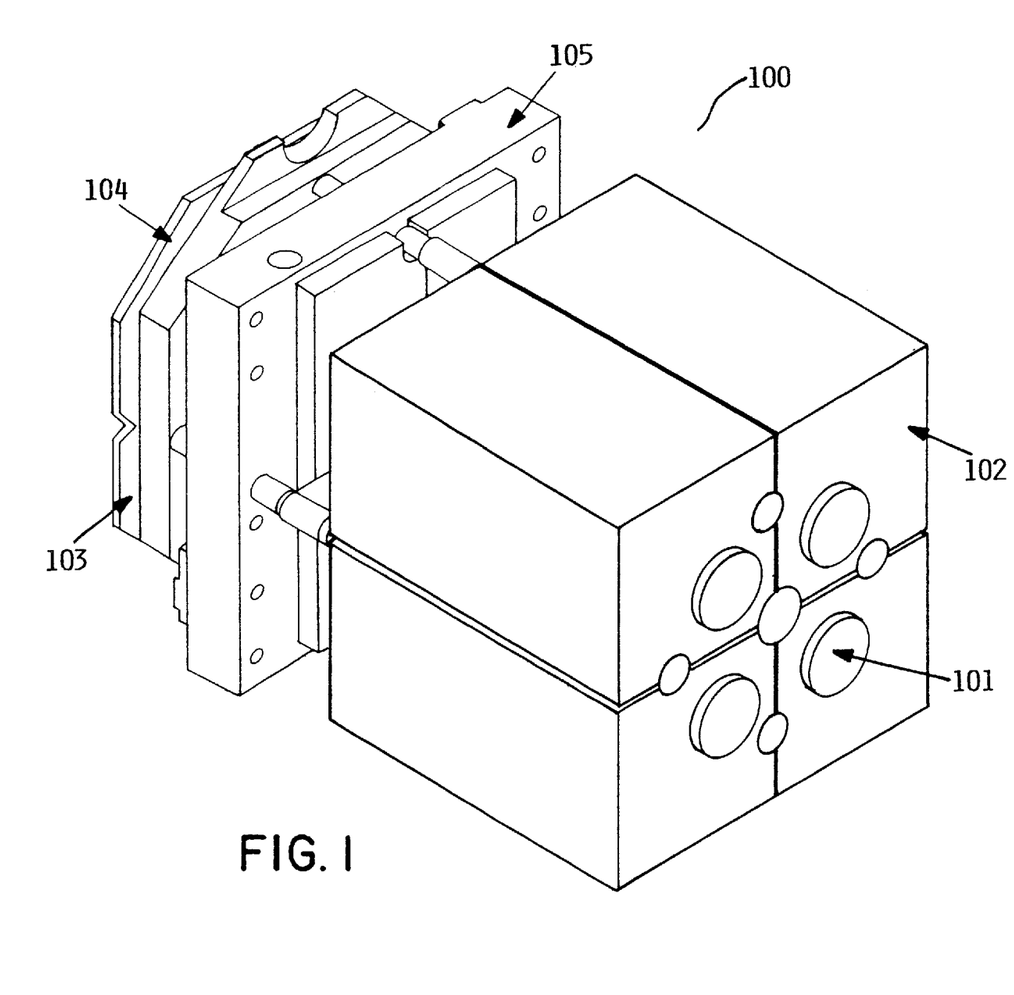
FIG. 1 shows an isometric view of the heat pipe/heat sink and module assembly.

Having reference now to the figures, the invention will be described in detail. FIG. 1 illustrates an isometric view 100 of a heat pipe/heat sink LGA assembly. This shows the general grouping of major module components in their finally assembled positions, but without the PWB and LGA interposer, which will be shown later. A heat pipe 101 is a hollow pipe, with sealed ends, and is made of copper, aluminum, or other suitable material with the mechanical strength and heat conductivity for the application. Heat pipe 101 is partially filled with a liquid such as deionized water. A partial vacuum lowers the boiling point of the liquid.

A heat sink 102 is attached to each heat pipe 101 by adhesive attach, brazing, press fitting, shrink fitting, or equivalent means. Heat sink 102 is made of aluminum, copper, or other appropriately thermally conductive material and usually has fins (not shown) to enhance the transfer of heat from the fin to the surrounding air. Alternatively, heat sink 102 could be a liquid cooled heat sink wherein heat is removed as liquid is pumped or convectively flows through pipes in the heat sink. Water is often the liquid used in liquid cooled heat sinks.

FIG. 1 shows four heat pipes 101, each with a heat sink 102 attached. A module cap 105 provides mechanical support for the module which is shown in a later figure. Module cap 105 provides for distribution of forces, also discussed later, and cylindrical holes through which heat pipes 101 enter. Load spring 104 distributes force to the center of a backside stiffener 103 as will be described later.

Figure 2:
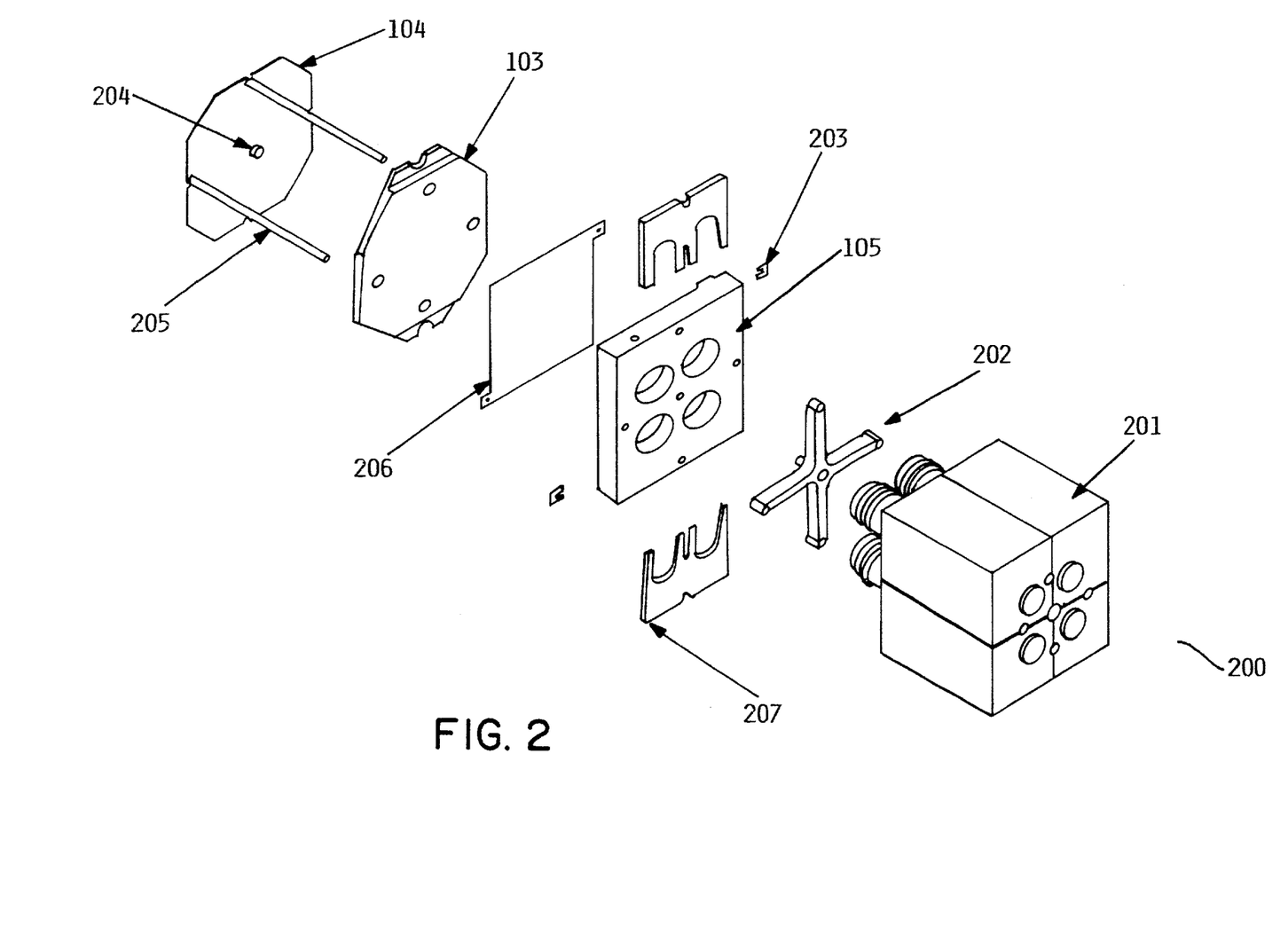
FIG. 2 shows an exploded view of the heat pipe/heat sink and module assembly.

FIG. 2 shows an exploded view of the heat pipe/heat sink LGA assembly, generally shown as 200.

A heat pipe heat sink assembly showing four heat pipes and their attached heat sinks is denoted as 201. A loading mechanism 202 is an X-shaped element, which will transfer force to a set of load posts 205. Four load posts 205 are normally used; two are shown for clarity in FIG. 2. Interposer retention clips 203 loosely hold an LGA interposer 206 against the bottom of the module. Load bushing 204 transfers force from load spring 104 to backside stiffener 103. A heat pipe load plate 207 presses heat pipe 101 against a semiconductor chip (not shown in FIG. 2).

Figure 3:
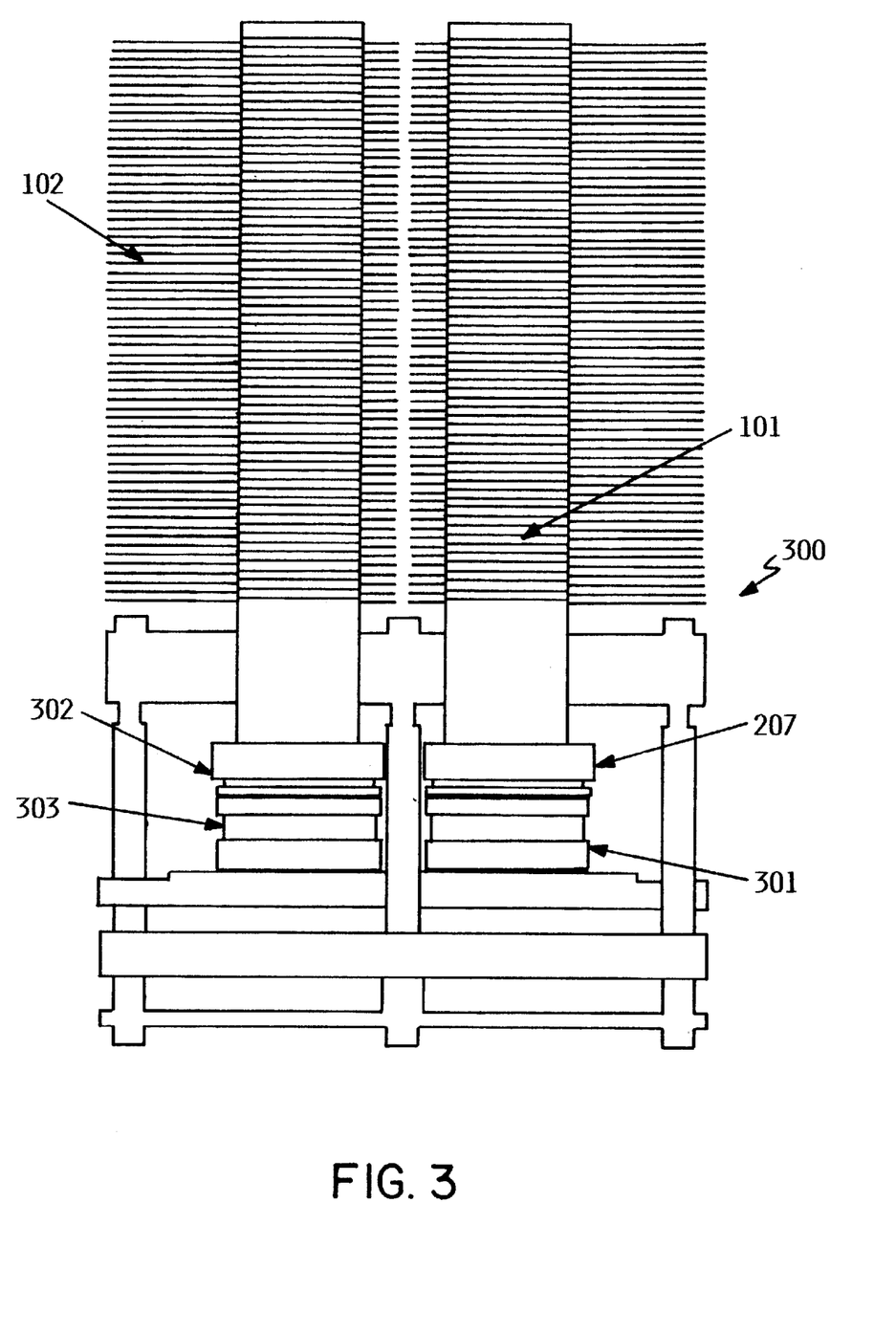
FIG. 3 shows a cutaway view showing the heat pipe/heat sink and module assembly.

FIG. 3 shows a cutaway side view of the heat pipe/heat sink LGA assembly. Heat pipes 101 and Heat sinks 102 are shown, with a load plate for heat pipe 207 pressed against a load collar 302, thereby compressing springs 303 against pistons 301 in a manner that will be shown in more detail in FIGS. 5, 6, 7, 8, and 9.

Figure 4:
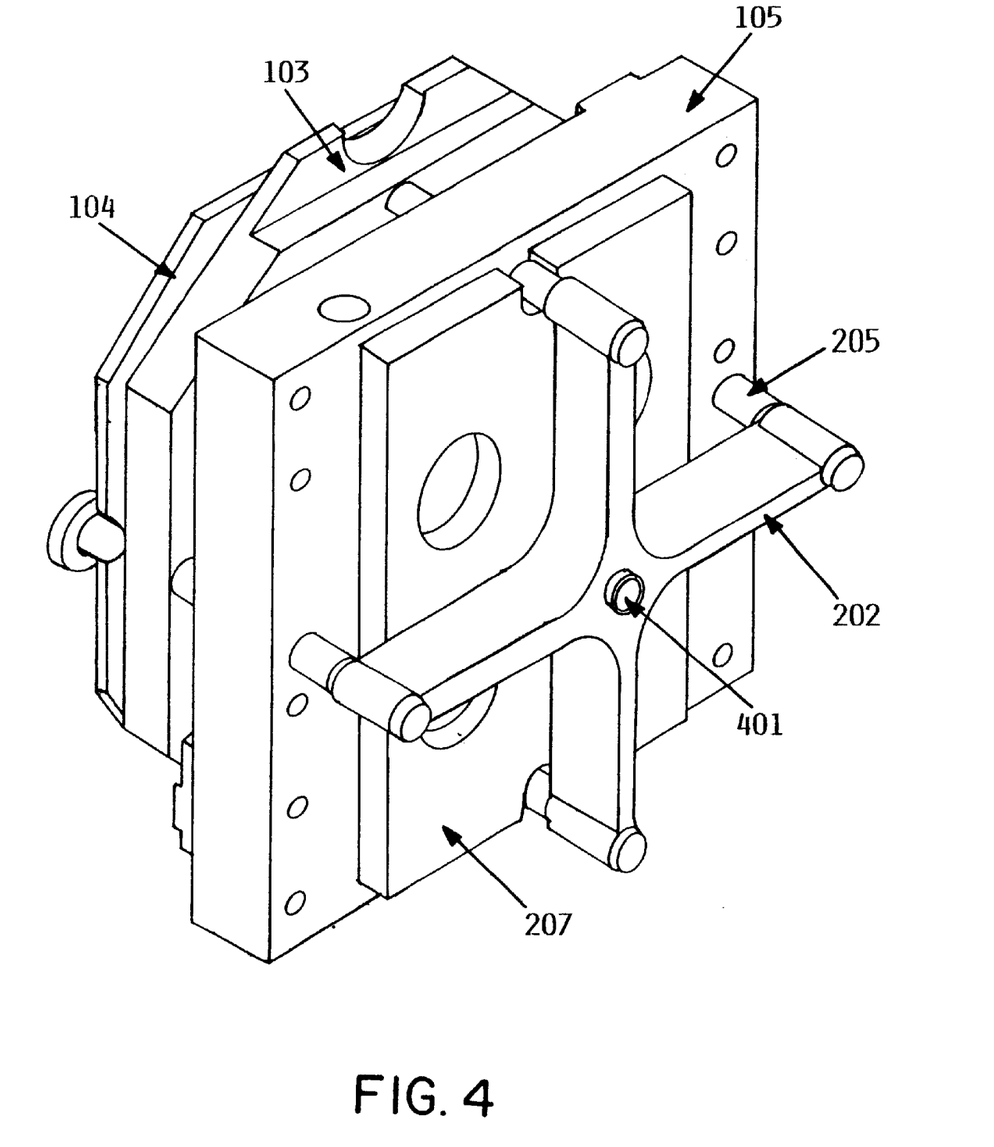
FIG. 4 shows an isometric view showing details of the loading mechanism and actuation screw.

FIG. 4 shows an isometric view of the assembly without heat pipes 101 and heat sinks 102. FIG. 4 shows an actuation screw 401, which is turned to actuate compressive force on the LGA as will be explained later.

Figure 5:
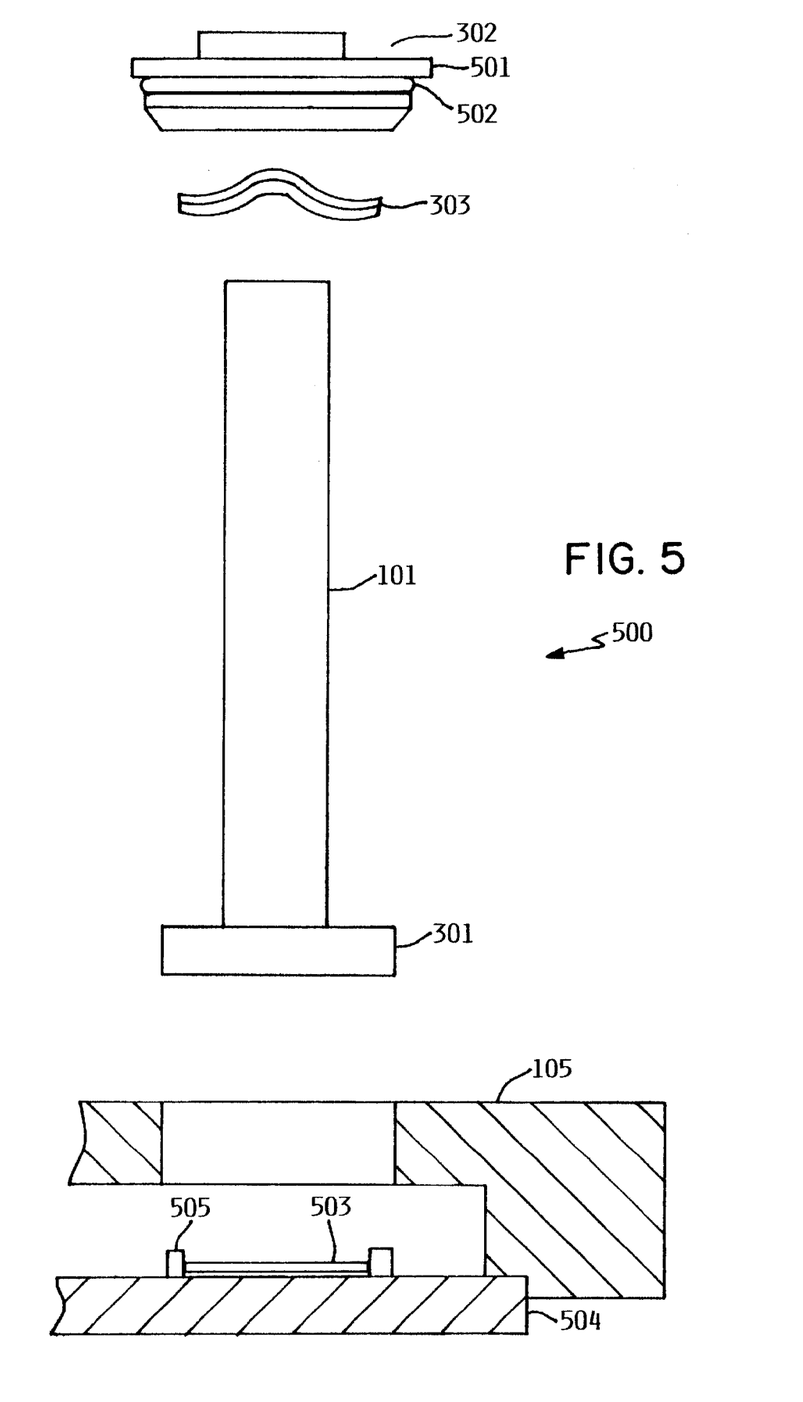
FIG. 5 shows an exploded partial cutaway view showing the module, chip, elastomeric window frame, module cap, piston, heat pipe, spring, and load collar.

FIG. 5 shows an exploded view of the heat transfer elements, generally denoted 500, detailing how piston 301 is loaded against a semiconductor chip 503. Piston 301 must be forced downward against chip 503, providing a thermal path to heat pipe 101. The amount of force must be large enough to ensure a good thermal path, but not so large that either chip 503 is damaged, or module 504 is separated from module cap 105. A bottom surface of piston 301 preferably has a spherical crown of a suitably large radius. This slight curvature allows for slight tilting of heat pipe 101 or mechanical tolerances in piston 301 or tolerances of the attachment of chip 503 to a module 504. Without the slight curvature, such tilting or tolerances could cause contact between piston 301 and chip 503 to occur at an edge or corner of the chip, leaving much of chip 503 an unacceptable distance away from the center of piston 301. A thin layer of indium a few microns thick can be used to spread the contact area and provide a good heat transfer path. Various types of thermal "grease" or "paste" can be used to enhance the thermal interface between the bottom of piston 301 and a top of chip 503. The piston/chip interface could also be thermally enhanced with a thermal pad or solder alloy. Any thermal enhancement that can be used between the top of chip 503 and the bottom of piston 301 is contemplated by this invention, and the examples given are illustrative only, and not limiting.

Figure 11:
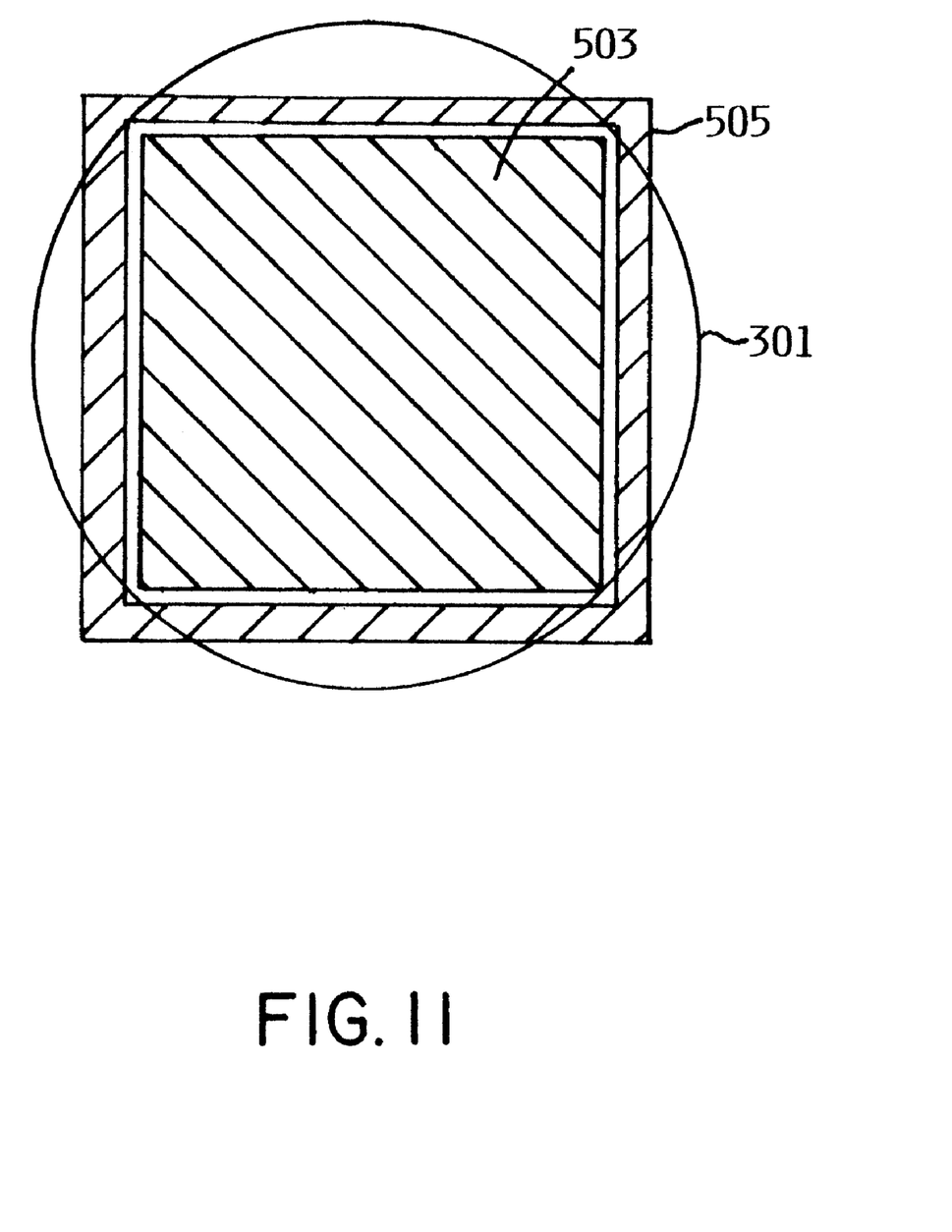
FIG. 11 shows a VLSI chip with an elastomeric window frame surrounding it. A circle shows the footprint of the piston.

During assembly, piston 301 and the lower part of heat pipe 101 are inserted through a hole in module cap 105. It is possible during this operation that heat pipe 101 can be dropped. An elastomeric window frame 505 is placed around chip 503 to prevent damage of chip 503 if heat pipe 101 is dropped. The height of elastomeric window frame 505 is slightly higher than the height of chip 503 as mounted on module 504. Elastomeric window frame 505 serves as a cushion, to prevent damage to chip 503, if heat pipe 101 is dropped. Any suitable elastomeric or cushioning material is contemplated by this invention, but an exemplary material would include polyurethane foam. One commercially available polyurethane foam is Poron® from Rogers Corporation. FIG. 11 shows the top view of chip 503, elastomeric window frame 505 around it and the footprint of piston 301. The relative dimensions are not important as long as the elastomeric window frame 505 can protect chip 503 in the event that heat pipe 101 is dropped. Elastomeric window frame 505 can be eliminated if the assembler chooses to accept the risk of damaging chip 503 or has effective means to prevent dropping heat pipe 101.

Spring 303 is any type of spring that can be made stiff enough to load appropriate force downward on the piston 301 against elastomeric window frame 505 and chip 503 for the amount of downward travel load collar 302 is designed to move. Spring 303 is advantageously a wave spring but could be a coil spring, an elastometer, or other suitable spring material.

Figure 6:
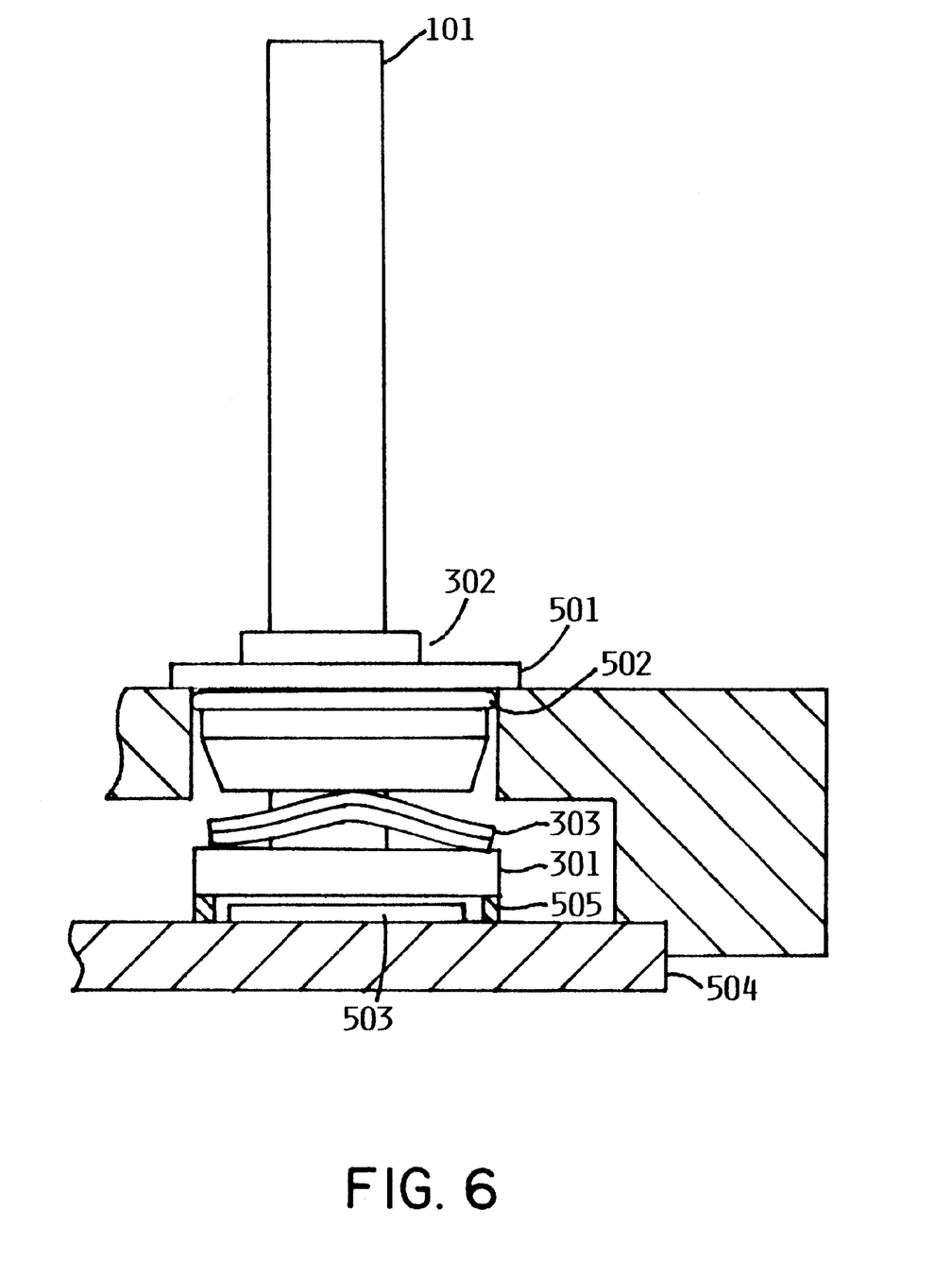
FIG. 6 shows the elements of FIG. 5, but with the spring under compression and the piston in contact with the chip.

Load collar 302 is designed so that it is free to slide on the lower portion of heat pipe 101. A load collar flange 501 is larger than the hole in module cap 105 that piston 301 and the lower portion of heat pipe 101 are inserted through. Load collar 302, when pushed downward as shown in FIG. 6, is stopped from further travel when load collar flange 501 contacts the top of module cap 105. The height of piston 301 and the distance from the bottom of load collar 302 to the bottom of load collar flange 501 and the height and stiffness of spring 303 are designed to exert a predetermined downward force from piston 301 to chip 503. The amount of force required depends on the size of chip 503; the manner by which chip 503 is joined to module 504; and the nature of the mechanical interface between chip 503 and piston 301.

Figure 7:
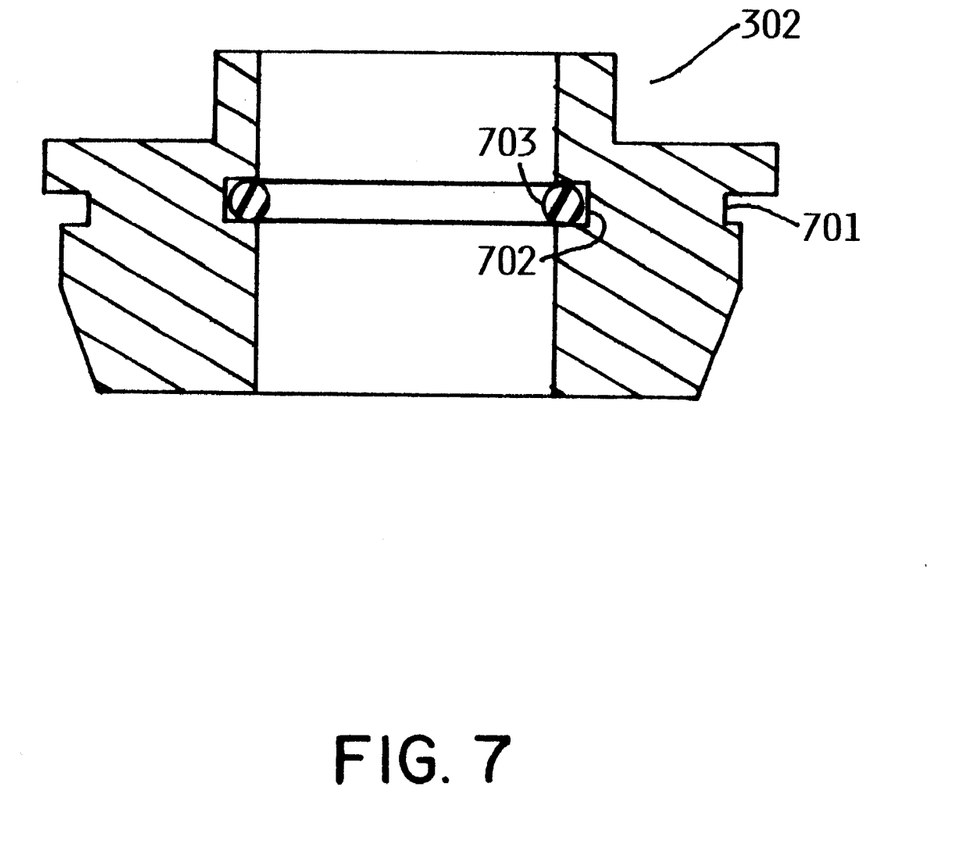
FIG. 7 shows a cross section of the load collar, showing the groove that retains the inner O-ring.

Contaminants must be kept from entering the volume between module cap 105 and module 504. Conventional means are used to join module 504 to module cap 105. One such joining product is Sylgard® from Dow Corning Corporation. This joining process also seals that path from contamination. Contaminants must also be prevented from entering the volume between module 504 and module cap 105 through the hole in module cap 105 that piston 301 is inserted through. This is accomplished by putting a groove 701 as shown in FIG. 7 and an O-ring 502 as shown in FIG. 5 around an outer periphery of load collar 302 below load collar flange 501, thus sealing the gap between the load collar 302 and the hole in module cap 105. There is another gap between heat pipe 101 and load collar 302. This gap is sealed as shown in FIG. 7 by putting groove 702 around an inner periphery of load collar 302, which retains inner O-ring 703.

FIG. 6 shows the components described in FIG. 5, but with load collar flange 501 in contact with the top of the module cap. Spring 303 is compressed and piston 301 has compressed the elastomeric window frame 502 and bears against chip 503. FIG. 6 shows a gap between piston 301 and chip 503, but this is only to distinctly show chip 503 and piston 301, which physically bears against chip 503 when load collar flange 501 is in contact with the top of the module cap. In this position, the thermal path from chip 503 to piston 301 to heat pipe 101 is complete. Heat is then transferred from the heat pipe 101 to heat sink 102 (shown in FIG. 1), where the heat is removed by convection, blowing air over the heat sink, or by running water or other liquid through the heat sink to carry away the heat.

Figure 8:
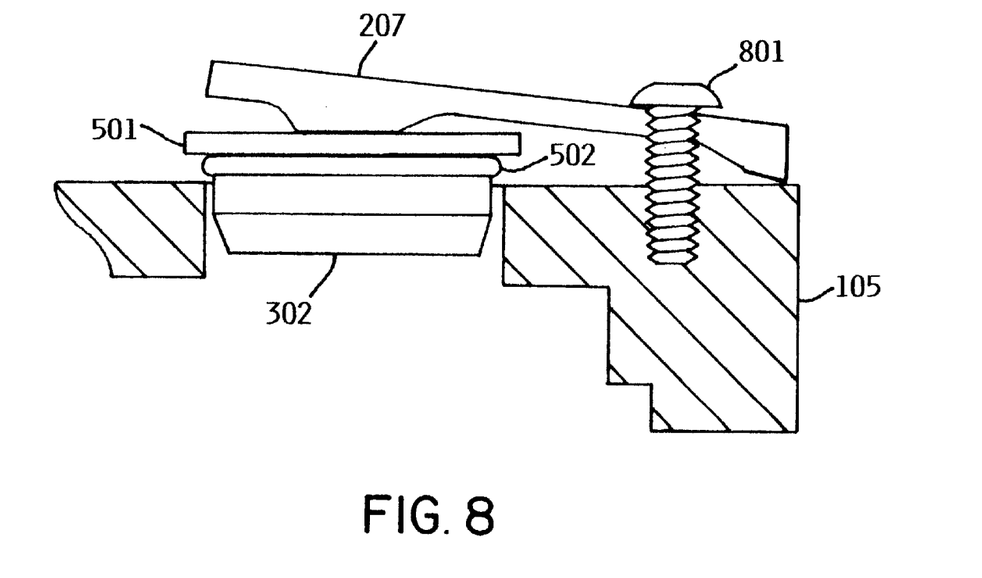
FIG. 8 shows a cross section of the module cap showing the load plate for heat pipe in a relaxed position and the load collar not fully engaged in its hole in the module cap.
Figure 9:
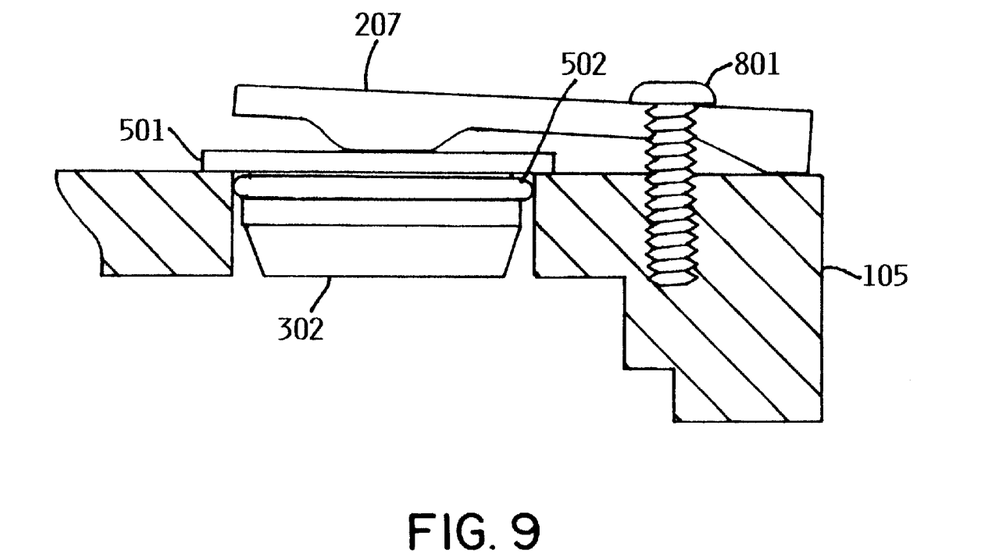
FIG. 9 shows a cross section of the module cap showing the load plate for heat pipe in its engaged position with the flange of the load collar pressed against the top of the module cap.
Figure 10:
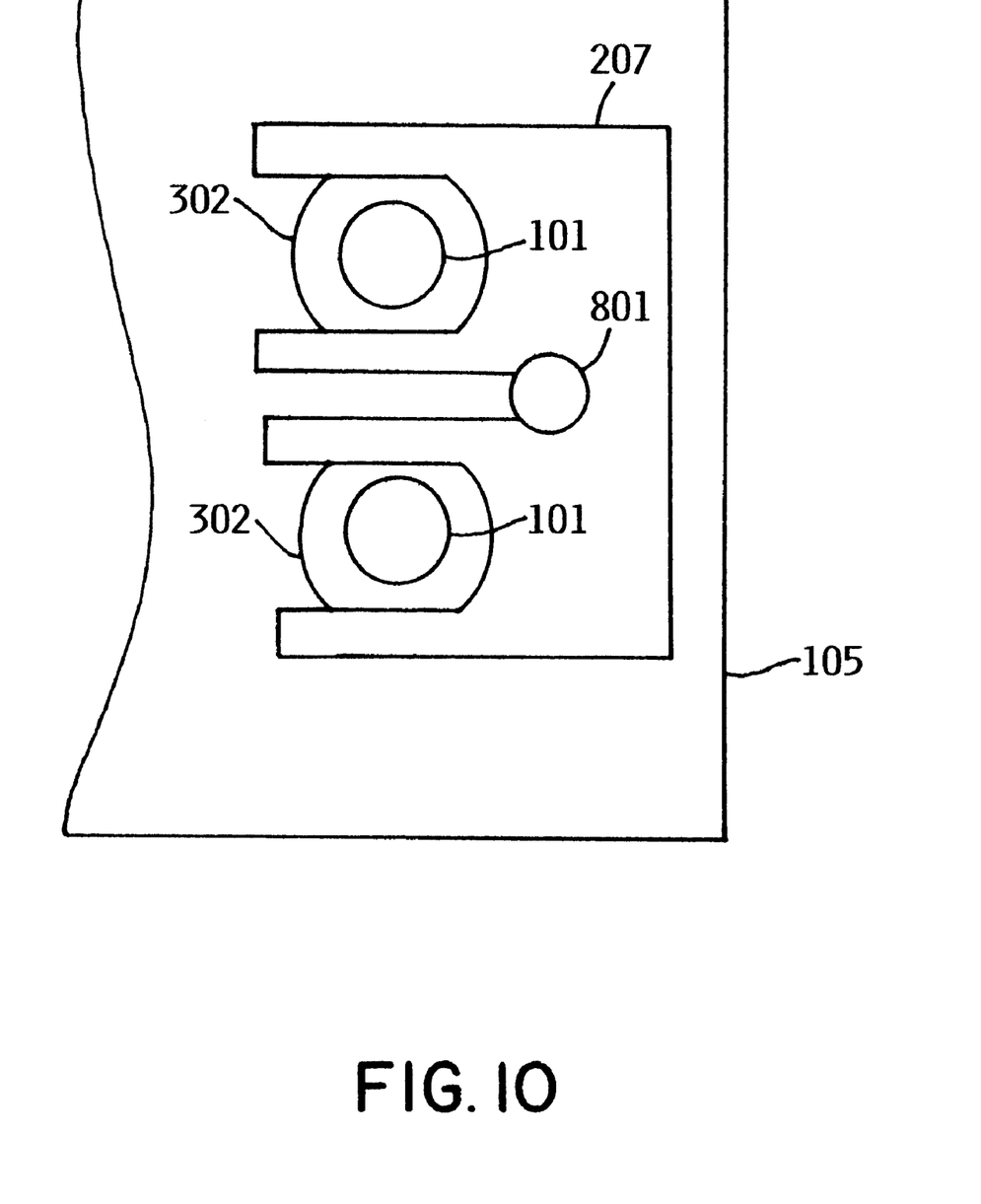
FIG. 10 shows a top view showing the load plate for heat pipe in a position to push down on two load collars.

FIGS. 8, 9, and 10 show one exemplary means for pushing down on load collar 302 until load collar flange 501 contacts the top of module cap 105. As load collar 302 is pushed downward it transfers force through spring 303 to piston 301, and loads piston 301 against chip 503.

FIG. 10 shows a top view of the preferred embodiment wherein a load plate for heat pipe 207 is used to push down on the tops of two load collars 302, thereby pushing two pistons against their respective chips as discussed above. Although FIG. 10 shows a single load plate 207 loading two load collars 302, individual load plates for each load collar could be used. FIG. 8 shows load plate for heat pipe 207 in an unloaded position. As described above, until load collar flange 501 is pushed down against the top of module cap 105, piston 301 in FIG. 5 is not pressed against chip 503. Load plate for heat pipe 207 is forced downwards against the top of load collar flange 501 in the exemplary FIG. 8 by turning a screw 801, pivoting load plate for heat pipe 207 around the point that load plate for heat pipe 207 contacts module cap 105. Note that since load collar flange 501 is part of load collar 302, a downward force can be exerted upon either flange 501 or load collar 302. FIG. 9 shows load collar flange 501 fully pushed down against the top of the module cap 105. Upon contact of load collar flange 501 with the top of module cap 105 screw 801 will stop turning. Since the predetermined force between chip 503 in FIG. 5 and piston 301 is determined by the geometries explained above and the spring constant of spring 303, there is no need to count the turns on screw 801 or to require torqueing tools to properly load piston 301 against chip 503. Any other suitable means to force load collar 302 downwards until load collar flange 501 contacts the top of module cap 105 can be used and are within the spirit and scope of the invention described and disclosed herein.

The above discussion has focused upon the invention's construction of the thermal path required to remove heat from chip 503. This invention also teaches the construction of this thermal path in concert with a design that allows compression of LGA interposer 206 in a uniform fashion, putting substantially equal force on all contact areas of LGA interposer 206, without interfering with the thermal path discussed above. The following discussion discloses how the independent loading of the LGA interposer is accomplished.

Figure 12:
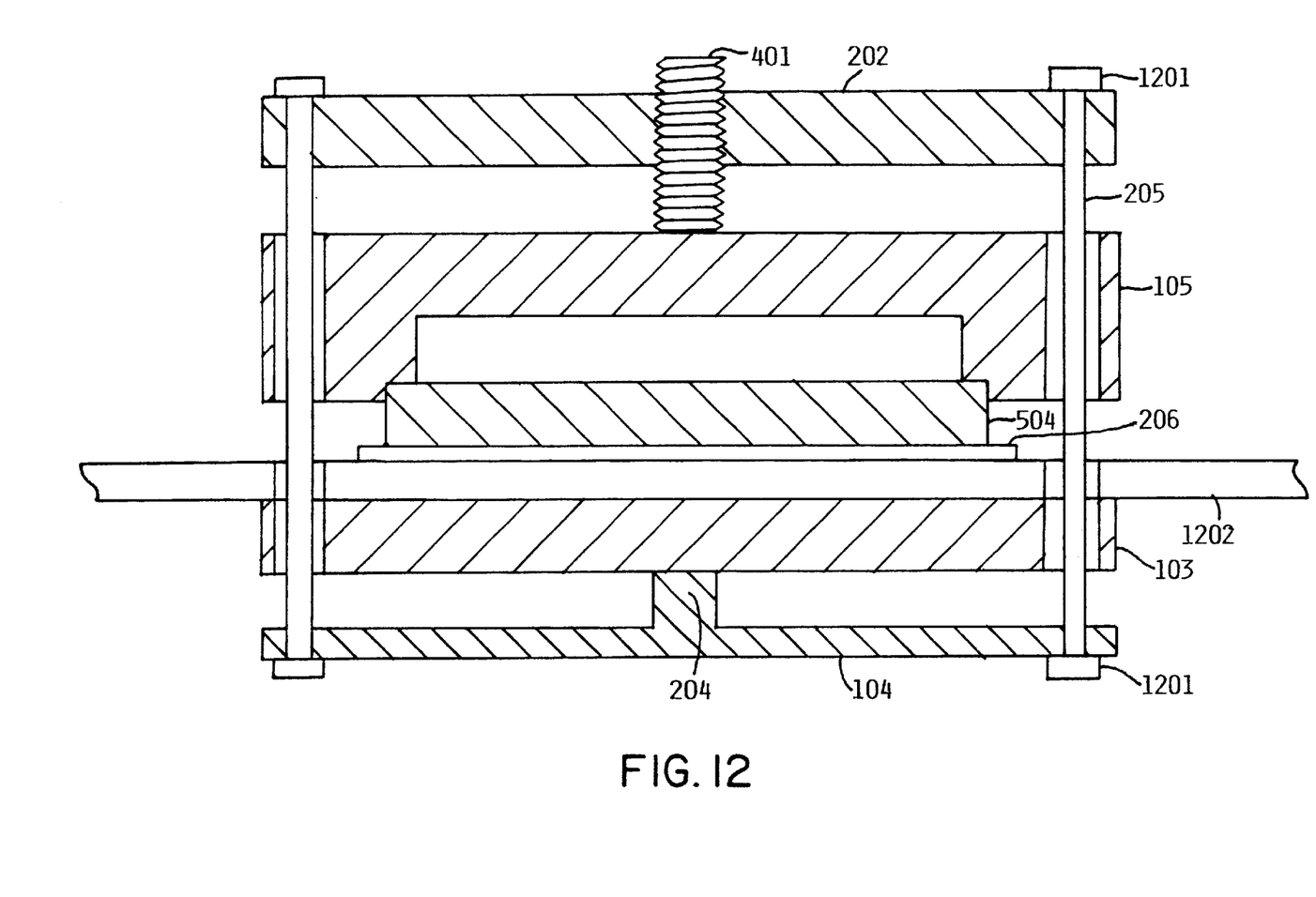
FIG. 12 shows a cross section of the module, the LGA interposer, and the card to illustrate where forces occur as the actuation screw is turned.

FIGS. 1, 2, 3, and 4 seen previously show the components of the hardware in isometric views. FIG. 12 will be used together with reference to the previous figures to describe the invention's provision for proper loading of the LGA interposer while allowing the independent loading of piston 301 against chip 503 as described above.

FIG. 12 shows a cutaway view of the assembly without the thermal components described above which load piston 301 against chip 503. Actuation screw 401 is turned, forcing loading mechanism 202 away from module cap 105 by pushing against the center of the top of module cap 105. As loading mechanism 202 is forced upward, the load posts 205 are also forced upwards because load post flanges 1201 are mechanically engaged with loading mechanism 202. Load posts 205 slideably go through the module cap; through or past LGA Interposer 206; slideably through a PWB 1202; and slideably through backside stiffener 103. Load posts 205 are then mechanically engaged with load spring 104. Load posts 205 thus pull upwards on load spring 104 at the points of mechanical engagement. Load bushing 204 transfers the force from load posts 205 to the center area of the backside stiffener 103. Backside stiffener 103 pushes upwards against a bottom of PWB 1202. Note that in some applications wherein wiring is done on the bottom of the PWB 1202 or for added insulation for the PWB, a nonconductive layer of plastic or other suitable material is placed between backside stiffener 103 and PWB 1202. This nonconductive layer is not shown in FIG. 12. It is important in large MCMs to bend module 504 and PWB 1202 with similar convexity, in order to uniformly load LGA interposer 206, as described earlier. In the current invention, this is accomplished by pushing upwards with load bushing 204 through backside stiffener 103. This will produce an upwardly convex deflection on PWB 1202. Module 504 is attached to module cap 105 on its top edges as also shown in FIG. 12. Since the module 504 is being pushed upward near its center through the force paths described above, deflection of the module 504 will also be convex upward, satisfying the need for similar convexity.

Figure 13:
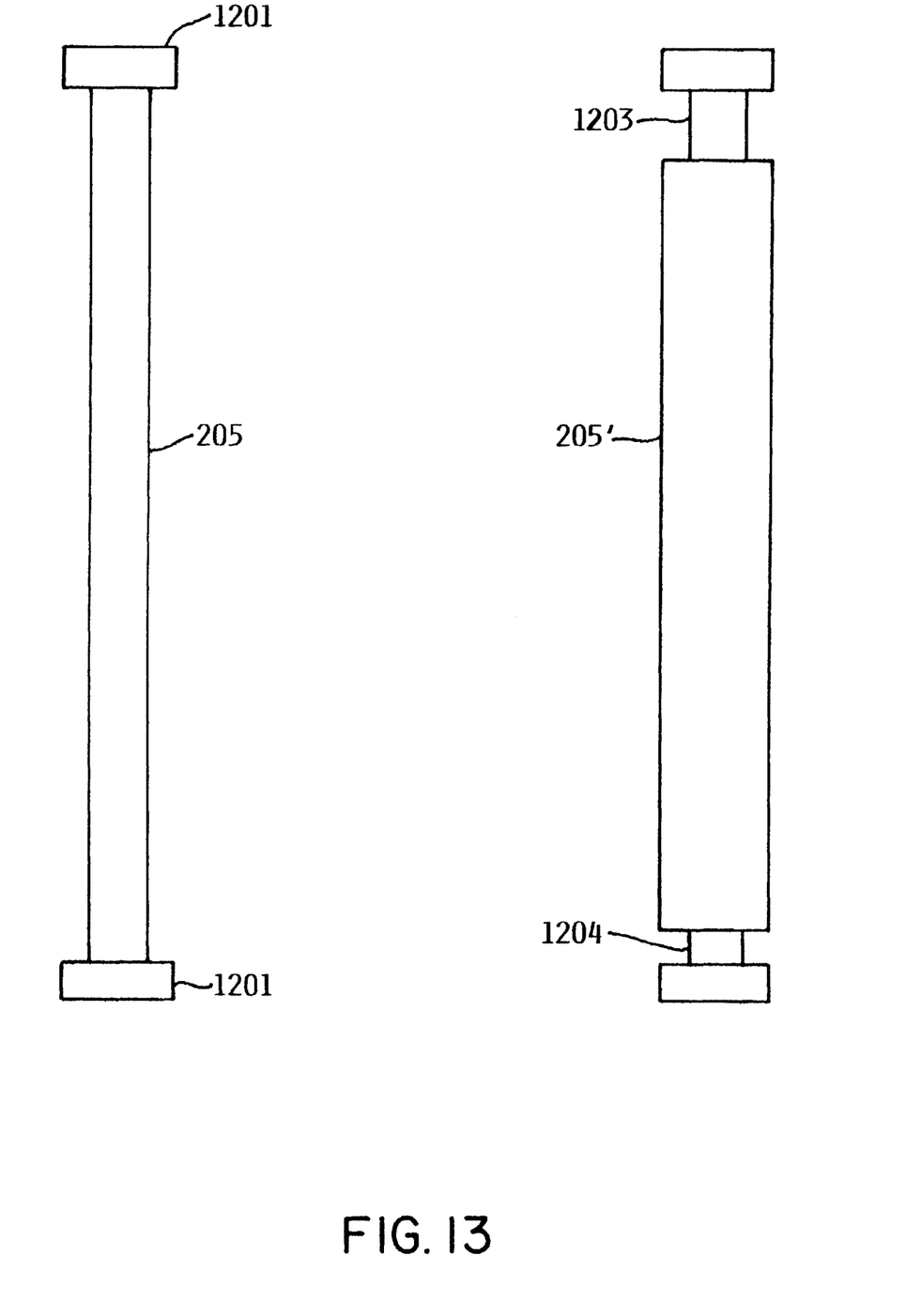
FIG. 13 shows two embodiments of the load posts.

Although load posts 205 are illustrated as simple cylinders with flanges at the ends, the invention is not so limited. A preferred embodiment has the entire length of load post 205 at the same width as load post flange 1201 except for the small parts of the length that engage loading mechanism 202 and load spring 104. FIG. 13 shows such a load post 205' as a cylindrical rod with a narrowed section 1203 which will mechanically engage loading mechanism 202, and another narrowed section 1204 which will mechanically engage load spring 104. An advantage of such a design is that there is less elongation of the load posts as the actuation screw is turned. Other variants of the load posts 205, such as making them tapered, octagonal, and so forth are within the spirit and scope of the invention described and disclosed herein.

In a preferred embodiment, loading mechanism 202 is X-shaped as shown in FIGS. 2 and 4 with four arms extending from the center. Each arm has a C-shaped form at or near the end of the arm. All four C-shaped forms are facing the same rotational direction, so that, for example, if said loading mechanism is rotated clockwise, the open side of each C-shaped form faces the direction of rotation. The C-shaped forms have essentially the same inner diameter as the outer diameter of load posts 205 directly below the load post flanges. In the load post embodiment 205', the C-shaped forms have essentially the same inner diameter as the outer diameter of narrowed section 1203. Actuation screw 401 is threaded through X-shaped loading mechanism 202. Until actuation screw 401 is tightened, X-shaped loading mechanism 202 turns freely around actuation screw 401, allowing easy mechanical engagement of the load posts 205 by the C-shaped forms by rotating X-shaped loading mechanism 202 slightly. Once this engagement has been done, load posts 205 will be pulled as actuation screw 401 is turned. Only a small degree of rotation of X-shaped loading mechanism 202 is required to engage load posts 205. In the large MCM, as shown in FIG. 1, X-shaped loading mechanism 202 is X-shaped to allow engaging load posts 205 without interfering with heat pipes 101. Other means of engaging load posts 205 with loading mechanism 202 could include threading the tops of the load posts and screwing them into threaded holes on the X-shaped arms. Other modified techniques to connect the load posts 205 to the loading mechanism 202 are considered to be within the spirit and scope of the current invention.

The present invention may be embodied in other specific forms without departing from its spirit or essential characteristics. The described embodiments are to be considered in all respects as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for cooling integrated circuit chips comprising:
    a module having at least one semiconductor integrated circuit chip mounted thereon; said module having a module cap attached with adhesive bonding; said module cap having a hole situated above each of said chips;
    a heat pipe with a piston attached at an end for each of said chips; said piston sized to fit through said hole; a bottom of said piston facing a top of said chip;
    a spring coaxially located on said heat pipe; a bottom of said spring bearing against a top of said piston; a top of said spring bearing against a bottom of a load collar; said load collar also being coaxially located on said heat pipe; a bottom portion of said load collar having a diameter small enough to fit through said hole;
    a flange at or near a top of said load collar; said flange being of larger diameter than said hole; and
    a load plate capable of bearing against a top of said load collar or flange; a bottom of said flange limiting penetration of said load collar into said hole upon contact with a top of said module cap.

2. The apparatus of claim 1, wherein a heat sink is attached to said heat pipe above the load collar.

3. The apparatus of claim 2, wherein said heat sink is attached to said heat pipe by press fitting, adhesive joining, soldering, brazing, spring clipping, or using screws or bolts.

4. The apparatus of claim 2, wherein said heat sink consists primarily of copper or aluminum.

5. The apparatus of claim 1, wherein said bottom portion of said load collar has a groove around its outer periphery surface; and an outer O-Ring held in place by said groove.

6. The apparatus of claim 1, wherein the load collar has a groove around its inner periphery; and an inner O-Ring held in place by said groove.

7. The apparatus of claim 1, wherein said load plate has a hole through which a screw is placed; said screw being turned into a threaded hole in said module cap; a head on said screw bearing against a top of said load plate as the screw is turned.

8. The apparatus of claim 1, wherein said load plate bears against the top of more than one load collar or flange.

9. The apparatus of claim 1, further comprising an elastomeric window frame, partially or completely surrounding said chip; a top of said frame being higher than the top of said chip; said piston contacting the top of said frame prior to said piston contacting the top of said chip as said piston is inserted through said hole in said module cap.

10. The apparatus of claim 1, wherein said bottom of said piston is convex.

11. The apparatus of claim 1, further comprising a thin layer of indium on said bottom of said piston.

12. The apparatus of claim 1, further comprising thermal grease, a thermal pad, or solder alloy between the top of said chip and the bottom of said piston.

13. A multichip land grid array module assembly comprising:
    a module upon which four semiconductor integrated circuit chips are mounted; said module having a module cap attached with adhesive bonding; a heat pipe for each of said chips; said heat pipes extending through said module cap;
    a bottom of said module being electrically coupled to a top surface of a printed wiring board via a land grid array interposer; said coupling accomplished by compression of said interposer between said bottom of said module and said top surface of said board;
    a backside stiffener with a top side positioned against a bottom side of said board; and
    a load bushing on a load spring;
    said load bushing bearing against a bottom side of said stiffener substantially at a center of said stiffener;
    said load spring being mechanically engaged with four load posts at or near a bottom end of each load post;
    said load posts extending upward through or past said stiffener, said board, said interposer, and said module cap; said load posts being mechanically engaged at or near a top end of each load post with an X-shaped loading mechanism;
    said loading mechanism having a threaded hole at its center; and
    an actuation screw threaded through said hole; said screw bearing against a top of said module cap as said screw is turned.

14. The multichip land grid array module assembly of claim 12, wherein said X-shaped loading mechanism has a C-shaped form at or near the end of each arm of the X-shape; said C-shaped forms all facing the same rotational direction.

15. The multichip land grid array module assembly of claim 13, wherein said C-shaped forms at the ends of the arms of said X-shaped loading mechanism mechanically engage said load posts as the X-shaped loading mechanism is rotated about said actuation screw.

16. A method of loading a heat pipe against a semiconductor integrated circuit chip mounted on a module consisting of:
    inserting a heat pipe with a piston affixed to a bottom end through a hole in a module cap; said hole being situated over said chip;
    placing a spring coaxially and slideably situated on said heat pipe;
    placing a load collar coaxially and slideably situated above said spring on said heat pipe;
    compressing said spring between a top of said piston and a bottom of said load collar; said compression forcing a bottom of said piston against a top of said chip with a predetermined force.

17. The method of claim 16 wherein the step of compressing said spring further comprises the step of forcing said load collar downward until further downward motion is stopped by a flange on said load collar contacts a top on said module cap.

18. The method of claim 17 wherein the step of forcing said load collar downward further comprises the step of turning a screw into a threaded hole on a top of said module cap; a head on said screw forcing a load plate downward upon a top of said load collar or a top of said flange.

* * * * *